(12) United States Patent
Kim et al.

(10) Patent No.: US 6,765,451 B2
(45) Date of Patent: Jul. 20, 2004

(54) METHOD AND APPARATUS FOR SHIELDING A COMPONENT OF AN ELECTRONIC COMPONENT ASSEMBLY FROM ELECTROMAGNETIC INTERFERENCE

(75) Inventors: Kevin Kim, Buffalo Grove, IL (US); Muhammad Kazkaz, Palatine, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/319,977

(22) Filed: Dec. 16, 2002

(65) Prior Publication Data

US 2004/0113712 A1 Jun. 17, 2004

(51) Int. Cl.$^7$ ............................................. H04B 3/28
(52) U.S. Cl. ................................ 333/12; 333/26
(58) Field of Search .................. 333/12, 26, 35, 333/151, 211; 343/700 MS

(56) References Cited

U.S. PATENT DOCUMENTS 5,949,383 A * 9/1999 Hayes et al. ................ 343/795
6,002,368 A * 12/1999 Faraone et al. ........ 343/700 MS
6,348,897 B1 * 2/2002 Alameh et al. .............. 343/702
6,559,809 B1 * 5/2003 Mohammadian et al. ... 343/795

* cited by examiner

*Primary Examiner*—Robert Pascal
*Assistant Examiner*—Dean Takaoka
(74) *Attorney, Agent, or Firm*—Steven A. May

(57) ABSTRACT

An electronic component assembly includes an electromagnetic interference (EMI)-producing component capable of generating EMI and an EMI-sensitive component. The electronic component assembly further includes a radiation shunt disposed proximate to the EMI-sensitive component capable of attracting at least a portion of the EMI and, by attracting the at least a portion of the EMI, shielding the EMI-sensitive component from the at least a portion of the EMI. By providing a radiation shunt to shield the EMI-sensitive component, a need is reduced for a mechanical shield that surrounds the EMI-sensitive component.

18 Claims, 1 Drawing Sheet

METHOD AND APPARATUS FOR SHIELDING A COMPONENT OF AN ELECTRONIC COMPONENT ASSEMBLY FROM ELECTROMAGNETIC INTERFERENCE

FIELD OF THE INVENTION

The present invention relates generally to electronic component assemblies that generate electromagnetic interference and in particular to shielding a component of an electronic component assembly from the electromagnetic interference generated by the assembly.

BACKGROUND OF THE INVENTION

Electromagnetic interference (EMI) poses a persistent problem for electronic component assemblies. An active component in an electronic component assembly, typically a semiconductor device such as a radio frequency (RF) power transistor in an RF power amplifier or a regulating switching device in a switching power supply, may radiate spectral energy, that is, harmonics, when respectively amplifying an RF signal or regulating an output voltage. In addition, an RF signal propagating along a passive component such as a transmission line disposed on a substrate may radiate spectral energy due to a difference between a dielectric constant of the air above the transmission line and a dielectric constant of the substrate below the transmission line. The spectral energy radiates into the atmosphere in a form of electromagnetic waves. The radiated electromagnetic waves may then couple into other components of the electronic component assembly, creating undesirable EMI for signals propagating through the other components. Furthermore, when the electronic component assembly is part of a telecommunication system, EMI that escapes the assembly, such as EMI that mixes with an amplified RF signal prior to the signal being output by an RF power amplifier, can pose unacceptable interference for other users of the RF spectrum. The EMI coupling into an output signal of an RF power amplifier can also create power control problems by distorting RF feedback power.

In order to control an amount of EMI radiated or propagated by an electronic component assembly, the assembly typically includes a housing, such as a machined aluminum housing, that functions as an electromagnetic shield. The housing is designed to contain the EMI generated by the components of the assembly. However, the housing does not protect the components of the assembly from EMI generated by other components of the assembly. In order to protect individual components, such as an output transmission line, of the assembly from EMI, electronic component assemblies typically surround the component with a mechanical shield that blocks the EMI from reaching the component. However, use of a mechanical shield is expensive, poses manufacturing problems involved in a placement of, and subsequent soldering of, the shield on a substrate, and poses a potential heat dissipation problem when the shield encloses an area where a high power RF signal is propagating along an output transmission line and/or through components serially coupled to the output transmission line. Accordingly, EMI reduction poses a persistent design problem for both mechanical and electrical designers of high power electronic component assemblies.

Therefore, there is a need for shielding a component, or an output signal, of an electronic component assembly from EMI generated by other components of the assembly without using a mechanical shield.

DETAILED DESCRIPTION OF THE INVENTION

To address the need for shielding a component, or an output signal, of an electronic component assembly from EMI generated by other components of the assembly without using a mechanical shield, an electronic component assembly is provided that includes an electromagnetic interference (EMI)-producing component capable of generating EMI and an EMI-sensitive component. The electronic component assembly further includes a radiation shunt disposed proximate to the EMI-sensitive component capable of attracting at least a portion of the EMI and, by attracting the at least a portion of the EMI, shielding the EMI-sensitive component from the at least a portion of the EMI. By providing a radiation shunt to shield the EMI-sensitive component, a need is reduced for a mechanical shield that surrounds the EMI-sensitive component.

Generally, one embodiment of the present invention encompasses an apparatus for shielding a component from EMI. The apparatus includes an EMI-sensitive component of an electronic component assembly and a radiation shunt disposed proximate to the EMI-sensitive component that attracts at least a portion of the EMI and, by attracting the at least a portion of the EMI, shields the EMI-sensitive component from the at least a portion of the EMI.

Another embodiment of the present invention encompasses an electronic component assembly that includes a substrate, an EMI-producing component that generates EMI, and an EMI-sensitive component disposed on the substrate. The assembly further includes a radiation shunt disposed proximate to the EMI-sensitive component that attracts at least a portion of the EMI.

Yet another embodiment of the present invention encompasses a method for controlling (EMI) in an electronic component assembly that includes a first component and a second component. The method includes generating, by the first component, electromagnetic interference and shielding, by an antenna, the second component from at least a portion of the electromagnetic interference.

Figure 1:
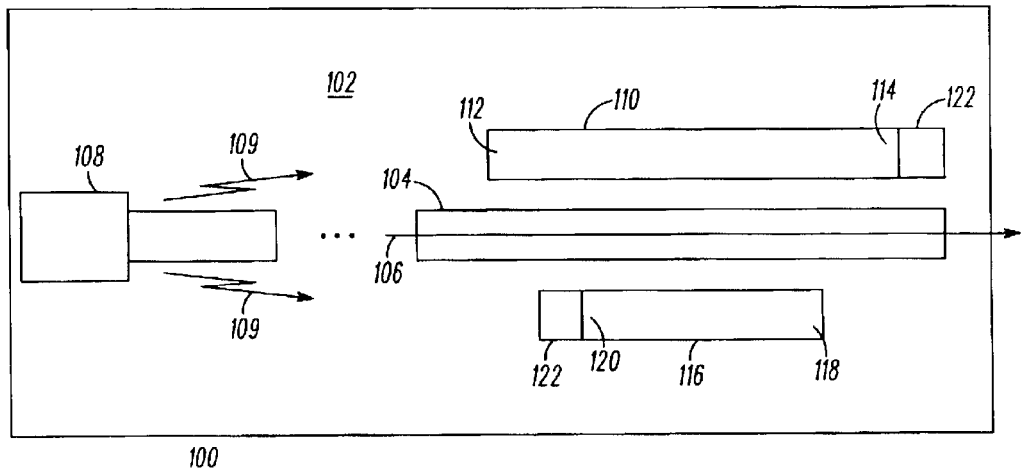
FIG. 1 is a schematic diagram of an exemplary electronic component assembly in accordance with an embodiment of the present invention.

The present invention may be more fully described with reference to FIGS. 1 and 2. FIG. 1 is a partial top view of a layout of an exemplary electronic component assembly 100, such as a radio frequency (RF) power amplifier or a switching power supply, in accordance with an embodiment of the present invention. Electronic component assembly 100 comprises a printed circuit board (PCB) that includes an EMI-sensitive component 104. Preferably, EMI-sensitive component 104 is a first transmission line that is disposed, preferably screened, on a substrate 102, such as an alumina substrate or an FR4 substrate. However, those who are of ordinary skill in the art realize that EMI-sensitive component 104 may any electrical component capable of coupling electromagnetic radiation, such as an inductive coil, a resistor, or a capacitor, without departing from the spirit and scope of the present invention. The first transmission line provides a propagation path for an output signal 106, such as an amplified radio frequency (RF) signal with respect to an RF power amplifier or a regulated voltage with respect to a switching power supply, produced by the electronic component assembly. The first transmission line is comprised of an electrically conductive metallic material, such as silver, copper, or a combination of silver and copper, that provides a low resistance path for output signal 106. The compositions of substrate 102 and the first transmission line are not critical to the present invention and one of ordinary skill in the art realizes that substrate 102 and the first transmission line may each be composed of any one or more of numerous materials without departing from the spirit and scope of the present invention.

Electronic component assembly 100 further includes an electromagnetic interference (EMI)-producing component 108 that is affixed to substrate 102. EMI-producing component 108 radiates electromagnetic waves 109 that are capable of coupling into EMI-sensitive component 104 and mixing with signal 106 propagating through the EMI-sensitive component. For example, EMI-producing component 108 may be an active component, typically a semiconductor device such as a radio frequency (RF) power transistor in an RF power amplifier or a voltage regulating switching device in a switching power supply, that radiates spectral energy, that is, harmonic energy, when respectively amplifying an RF signal or regulating an output voltage. By way of another example, EMI-producing element 108 may be a passive component, such as a second transmission line. When an RF signal propagates along the second transmission line, spectral energy may be produced as a result of a difference between a dielectric constant of the air above the second transmission line and a dielectric constant of substrate 102. The spectral energy then radiates in a form of electromagnetic waves 109 into the surrounding atmosphere.

Electronic component assembly 100 further includes a housing (not shown), such as a machined aluminum housing. Preferably, the housing comprises a base and a lid that, when fastened together, define an inner chamber in which components 102, 104, 108, 110, 116, and 122 are disposed. The housing is designed to contain EMI 109 generated by EMI-producing component 108 and radiated by the component into the inner chamber. However, in the prior art, a mechanical shield is required in order to prevent at least a portion of the EMI generated by an EMI-producing component from coupling into an EMI-sensitive component and mixing with a signal propagating through the EMI-sensitive component.

In order to reduce an amount of EMI coupling onto the EMI-sensitive component 104 and mixing with output signal 106 without utilizing a mechanical shield, electronic component assembly 100 further includes at least one radiation shunt 110, 116 (two shown). Although FIG. 1 depicts radiation shunts 110, 116 as being disposed on opposite sides of shielded component 104, the layout depicted in FIG. 1 is merely an exemplary layout for the purpose of illustrating the principles of the present invention and is not intended to limit the invention in any way. Those who are of ordinary skill in the art realize that the layout of radiation shunts 110, 116 is up to a designer of electronic component assembly 100 and that other layouts of radiation shunts 110, 116 may be utilized herein without departing from the spirit and scope of the present invention, such as disposing each radiation shunt 110, 116 on a same side, instead of on opposite sides, of shielded component 104.

Each radiation shunt 110, 116 presents an attractive path to EMI 109 and serves as an alternative route, relative to EMI-sensitive component 104, for the EMI, that is, the radiated spectral or harmonic energy. By presenting an alternative and an attractive path for EMI 109, each radiation shunt 110, 116 attracts at least a portion of the EMI. The at least a portion of the EMI, that is, at least a portion of the radiated spectral energy, couples to the shunt 110, 116 and is thereby redirected away from EMI-sensitive component 104. By redirecting the radiated spectral energy, each radiation shunt 110, 116 reduces an amount of spectral energy coupling into EMI-sensitive component 104, thereby shielding component 104 from at least a portion of the radiated spectral energy and reducing an amount of interference that might otherwise mix with signal 106. Each radiation shunt 110, 116 then routes the coupled EMI, or radiated spectral or harmonic energy, to a ground or a matched load.

In order to shield EMI-sensitive component 104 from the radiated spectral energy, that is, EMI 109, each radiation shunt 110, 116 is disposed proximate to the transmission line 104. For example, as depicted in FIG. 1, each radiation shunt 110, 116 is disposed approximately parallel to the shielded component while being separated from the transmission line by a predetermined distance. Preferably, the distance of separation is sufficiently small to facilitate a redirection of radiated spectral energy away from EMI-sensitive component 104, yet sufficiently large to result in a poor coupling coefficient with respect to a fundamental frequency of signal 106 propagating through component 104. For example, in one embodiment of the present invention, the separation distance of each radiation shunt 110, 116 may be approximately equal to a dielectric thickness, that is, to a thickness of substrate 102. However, those who are of ordinary skill in the art realize that a distance of separation may vary subject to many factors involved in a design of an electronic component assembly, such as assembly substrate materials and components and a frequency of a signal propagating through an EMI-sensitive component, without departing from the spirit and scope of the present invention.

Preferably, each radiation shunt 110, 116 comprises a transmission line that functions as a monopole antenna and that is disposed on, preferably screened on, substrate 102. The screening material preferably comprises an electrically conductive metallic material, such as such as silver, copper, or a combination of silver and copper, similar to the first transmission line. However, those who are of ordinary skill in the art realize that other electrically conductive metallic materials may be used in each radiation shunt 110, 116 without departing from the spirit and scope of the present invention. A first end 112, 118 of each monopole antenna 110, 116 is an open circuit. A second end 114, 120 of each monopole antenna 110, 116 is coupled to an antenna termination 122, such as a circuit ground. The ground reflects at least a portion of the coupled EMI and radiates, via the antenna, the reflected EMI away from EMI-sensitive component 104. In another embodiment of the present invention, termination 122 may be a matched load that is designed to dissipate the spectral energy coupled into the radiation shunt.

A length of each monopole antenna 110, 116 preferably is approximately one-half (½) a wavelength of a harmonic of the spectral energy produced by EMI-producing component 108. For example, a length of monopole antenna 110 may be one-half (½) of a wavelength of an even harmonic, that is, one-quarter (¼) of a wavelength of a fundamental frequency of an RF signal 106 amplified by component 108 when component 108 is an RF power transistor or of a switching frequency when component 108 is a switching device, and attracts even harmonics of the fundamental frequency that are included in EMI 109. In such an example, a length of monopole antenna 116 may be one-half (½) of a wavelength of an odd harmonic, that is, one-quarter (¼) of one-half (½) of a wavelength of the fundamental frequency or switching frequency, and attracts odd harmonics of the fundamental frequency or switching frequency that are included in the EMI. The energy attracted by each antenna 110, 116 couples to the antenna, thereby shielding the EMI-sensitive component 104 from the attracted energy.

Figure 2:
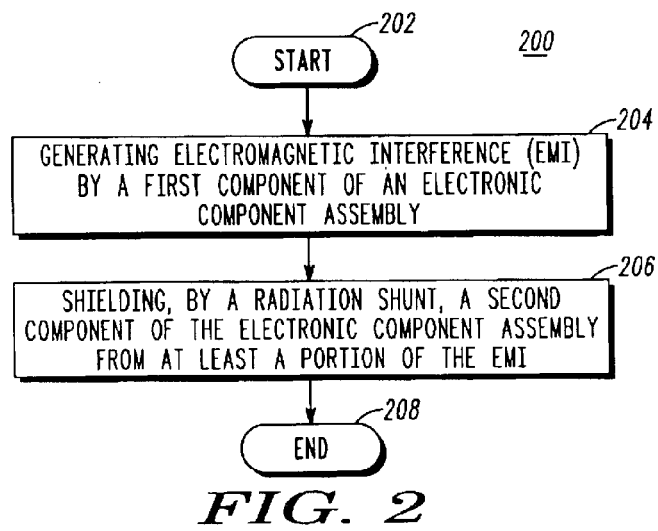
FIG. 2 is a logic flow diagram of steps performed by an electronic component assembly in shielding a component of the assembly from electromagnetic interference in accordance with an embodiment of the present invention.

FIG. 2 is a logic flow diagram 200 of steps performed by an electronic component assembly 100 in shielding a component of the assembly from EMI 109 in accordance with an embodiment of the present invention. Logic flow diagram 200 begins (202) when a first component of assembly 100, that is, EMI-producing component 108, generates (204) EMI 109. Typically EMI 109 comprises spectral, or harmonic, energy. For example, when EMI-producing component 108 is an RF power transistor that amplifies an RF signal, the spectral energy may comprise energy associated with harmonics of a fundamental frequency of the RF signal. By way of another example, when the EMI-producing component 108 is a switching device of a switching power supply, the spectral energy may comprise energy associated with harmonics of a switching frequency of the switching device. A radiation shunt 110, 116, preferably a microstrip antenna, then shields (206) a second component 104 of assembly 100, such as a transmission line, from at least a portion of the EMI produced by the first component, and the logic flow ends (208).

In one embodiment of the present invention, radiation shunt 110, 116 may be a monopole antenna. As described above, the monopole antenna may be of a length approximately equal to one-half (½) of a wavelength of a harmonic associated with the EMI generated by component 108, thereby attracting and coupling energy associated with the harmonic and shielding the second component 104 from the coupled energy. In one embodiment of the present invention, the antenna is open at a first end and coupled to a ground at a second end. The antenna routes the coupled energy to the ground. The ground may then reflect at least a portion of coupled energy and cause the antenna to re-radiate the coupled energy into the atmosphere of the electronic component assembly 100 and away from second component 104. In another embodiment of the present invention, instead of being coupled to the ground, the monopole antenna may be coupled to a matched load at the second end, which load dissipates at least a portion of the coupled energy.

By providing a radiation shunt 110, 116 that is coupled proximate to an EMI-sensitive component 104, electronic component assembly 100 shields the EMI-sensitive component from energy radiated by an EMI-producing component 108. Preferably, radiation shunt 110, 116 is an antenna screened onto a substrate 102 of assembly 100, thereby reducing a need for a mechanical shield to surround EMI-sensitive component 104. By reducing a need for a mechanical shield, the use of radiation shunt 110, 116 in assembly 100 reduces assembly manufacturing costs, eliminates manufacturing problems involved in a placement of, and subsequent soldering of, the shield on a substrate, and further eliminates a possible heat dissipation problem posed by the shield enclosing an area where a high power RF signal is propagating a long an output transmission line and/or through components serially coupled to the output transmission line.

While the present invention has been particularly shown and described with reference to particular embodiments thereof, it will be understood by those skilled in the art that various changes may be made and equivalents substituted for elements thereof without departing from the scope of the invention as set forth in the claims below. Accordingly, the specification and figures are to be regarded in an illustrative rather then a restrictive sense, and all such changes and substitutions are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any variation thereof, are intended to cover a non-exclusive inclusion, such that a process, method, article, or apparatus that comprises a list of elements does not include only those elements but may include other elements not expressly listed or inherent to such process, method, article, or apparatus. It is further understood that the use of relational terms, if any, such as first and second, top and bottom, and the like are used solely to distinguish one entity or action from another entity or action without necessarily requiring or implying any actual such relationship or order between such entities or actions.

What is claimed is:

1. An apparatus for shielding a component from electromagnetic interference (EMI) comprising:
   an EMI-sensitive component of an electronic component assembly; and
   a plurality of radiation shunts disposed proximate to the EMI-sensitive component, wherein the EMI comprises spectral energy, wherein a first radiation shunt of the plurality of radiation shunts attracts a first portion of the spectral energy, wherein a second radiation shunt of the plurality of radiation shunts attracts a second portion of the spectral energy, and wherein the first and second radiation shunts, by attracting at least a portion of the EMI, shields the EMI-sensitive component from the at least a portion of the EMI.

2. The apparatus of claim 1, wherein the EMI-sensitive component is a transmission line.

3. The apparatus of claim 1, wherein the plurality of radiation shunts are screened on a substrate.

4. The apparatus of claim 1, wherein the spectral energy comprises energy associated with a plurality of harmonics, wherein the first radiation shunt is designed to attract an energy associated with an even harmonic of the plurality of harmonics, and wherein the second radiation shunt is designed to attract an energy associated with an odd harmonic of the plurality of harmonics.

5. An electronic component assembly comprising:
   a substrate;
   an electromagnetic interference (EMI)-producing component that generates EMI;
   a EMI-sensitive component disposed on the substrate; and
   a radiation shunt that is screened on a substrate, is disposed proximate to the EMI-sensitive component, and attracts at least a portion of the EMI, wherein the radiation shunt comprises a monopole antenna having a first end and a second end, wherein the first end of the monopole antenna is open circuited, and wherein the second end of the monopole antenna is coupled to a load capable of dissipating EMI coupled to the antenna.

6. An apparatus for shielding a component from electromagnetic interference (EMI) comprising:
   an EMI-sensitive component of an electronic component assembly; and
   a radiation shunt screened on a substrate and disposed proximate to the EMI-sensitive component that attracts at least a portion of the EMI and, by attracting the at least a portion of the EMI, shields the EMI-sensitive component from the at least a portion of the EMI, wherein the EMI comprises energy associated with a plurality of harmonics, wherein the radiation shunt comprises a monopole antenna, and wherein a length of the monopole antenna is approximately one-half (½) of a wavelength of a harmonic of the plurality of harmonics.

7. An apparatus for shielding a component from electromagnetic interference (EMI) comprising:
   an EMI-sensitive component of an electronic component assembly; and a radiation shunt screened on a substrate and disposed proximate to the EMI-sensitive component that attracts at least a portion of the EMI and, by attracting the at least a portion of the EMI, shields the EMI-sensitive component from the at least a portion of the EMI, wherein the radiation shunt comprises a monopole antenna having a first end and a second end, wherein the first end of the monopole antenna is open circuited, and wherein the second end of the monopole antenna is coupled to a ground.

8. An apparatus for shielding a component from electromagnetic interference (EMI) comprising:

an EMI-sensitive component of an electronic component assembly; and a radiation shunt screened on a substrate and disposed proximate to the EMI-sensitive component that attracts at least a portion of the EMI and, by attracting the at least a portion of the EMI, shields the EMI-sensitive component from the at least a portion of the EMI, wherein the radiation shunt comprises a monopole antenna having a first end and a second end, wherein the first end of the monopole antenna is open circuited, and wherein the second end of the monopole antenna is coupled to a load capable of dissipating electromagnetic interference coupled to the antenna.

9. An electronic component assembly comprising:

a substrate;

an electromagnetic interference (EMI)-producing component that generates EMI;

a EMI-sensitive component disposed on the substrate; and a plurality of radiation shunts disposed proximate to the EMI-sensitive component, wherein the EMI comprises spectral energy, wherein a first radiation shunt of the plurality of radiation shunts attracts a first portion of the spectral energy, and wherein a second radiation shunt of the plurality of radiation shunts attracts a second portion of the spectral energy.

10. The electronic component assembly of claim 9, wherein the plurality of radiation shunts are screened on a substrate.

11. The electronic component assembly of claim 9, wherein the spectral energy comprises energy associated with a plurality of harmonics, wherein the first radiation shunt is designed to attract an energy associated with an even harmonic of the plurality of harmonics, and wherein the second radiation shunt is designed to attract an energy associated with an odd harmonic of the plurality of harmonics.

12. An electronic component assembly comprising:

a substrate;

an electromagnetic (EMI)-producing component that generates EMI;

a EMI-sensitive component disposed on the substrate; and a radiation shunt that is screened on a substrate, is disposed proximate to the EMI-sensitive component, and attracts at least a portion of the EMI, wherein the radiation shunt comprise a monopole antenna having a first end and a second end, wherein the first end of monopole antenna is open circuited, and wherein the second end of the monopole antenna is coupled to ground.

13. An electronic component assembly comprising:

a substrate;

an electromagnetic interference (EMI)-producing component that generates EMI;

a EMI-sensitive component disposed on the substrate; and a radiation shunt screened on a substrate and disposed proximate to the EMI-sensitive component that attract at least a portion of the EMI, wherein the EMI comprises energy associated with a plurality of harmonics, wherein the radiation shunt comprises a monopole antenna, and wherein a length of the monopole antenna is approximately one-quarter ($\frac{1}{4}$) of a wavelength of a harmonic of the plurality of harmonics.

14. An electronic component assembly comprising:

a substrate;

an electromagnetic interference (EMI)-producing component that generates EMI;

a EMI-sensitive component disposed on the substrate; and a radiation shunt that is screened a substrate, is disposed to the EMI-sensitive component, and attracts at least a portion of the EMI, wherein the EMI comprises energy associated with a plurality of harmonics, wherein the radiation shunt comprises a monopole antenna, and wherein a length of the monopole antenna is approximately one-half ($\frac{1}{2}$) of a wavelength of a harmonic of the plurality of harmonics.

15. A method for controlling EMI in an electronic component assembly comprising a first component and a second component, the method comprising:

generating, by the first component, electromagnetic interference; and shielding, by a monopole antenna that is screened on a substrate, the second component from at least a portion of the electromagnetic interference, wherein the EMI comprises energy associated with a plurality of harmonics and wherein a length of the monopole antenna is one of approximately one-quarter ($\frac{1}{4}$) of a wavelength of a harmonic of the plurality of harmonics and approximately one-half ($\frac{1}{2}$) of a wavelength of a harmonic of the plurality of harmonics.

16. The method claim 15, wherein shielding comprises attracting, by the antenna, energy associated with at least one harmonic of the plurality of harmonics.

17. The method of claim 16, wherein shielding further comprises coupling the energy attracted by the antenna to a ground.

18. The method of claim 16, wherein shielding further comprises:

coupling the energy attracted by the antenna to a load; and dissipating, by the load, at least a portion of the attracted energy.

* * * * *